United States Patent [19]

Twigg et al.

[11] Patent Number: 5,184,068
[45] Date of Patent: Feb. 2, 1993

[54] ELECTRONIC DEVICE TEST HANDLER

[75] Inventors: Ray G. Twigg; Mark W. Klug, both of San Diego; Santino Marrone, Poway; Malcolm V. Hawkes, San Diego, all of Calif.

[73] Assignee: Symtek Systems, Inc., San Diego, Calif.

[21] Appl. No.: 845,744

[22] Filed: Mar. 2, 1992

Related U.S. Application Data

[63] Continuation of Ser. No. 587,218, Sep. 24, 1990, abandoned.

[51] Int. Cl.$^5$ ............................................. G01R 31/28
[52] U.S. Cl. ................................ 324/158 F; 209/573; 361/380
[58] Field of Search ............... 324/73.1, 158 F, 158 P; 209/573, 574; 361/380, 383, 384, 390, 391, 415, 417, 419, 420

[56] References Cited

U.S. PATENT DOCUMENTS

| | | |
|---|---|---|
| 3,094,212 | 6/1963 | Moore et al. |
| 3,209,907 | 10/1965 | Wiesler et al. |
| 3,408,565 | 10/1968 | Frick et al. |
| 3,664,499 | 5/1972 | Sahakian |
| 3,996,517 | 12/1976 | Fergason et al. |
| 4,683,424 | 7/1987 | Cutright et al. ................... 361/415 |
| 4,694,964 | 12/1987 | Ueberreiter |
| 4,695,707 | 12/1987 | Young |
| 4,908,126 | 3/1990 | Willberg et al. ................ 324/158 F |
| 4,926,118 | 5/1990 | O'Connor et al. |
| 4,993,136 | 2/1991 | Kerschner et al. ............. 324/158 F |

OTHER PUBLICATIONS

Fromer et al., "Chip Handler Apparatus for Testing Semiconductor Devices," IBM Technical Disclosure Bulletin; vol. 20, No. 3; Aug. 1977; pp. 1100-1101.

Primary Examiner—Gregory D. Thompson
Attorney, Agent, or Firm—Thomas J. Tighe

[57] ABSTRACT

A device for automatically presenting electronic devices to a tester for testing. A plurality of carriers, each for carrying a set of electronic devices are cyclically conveyed in a close loop from a loading stage where electronic devices are loaded onto the carriers, through a pre-test chamber, such as a "soak" chamber, from the pre-test chamber to a test stage where the devices are preferably lifted from the carrier to come into contact with a test head contactor for testing, from the test stage to a post-test chamber, such as "un-soak" chamber, through the post-test chamber to an unloading stage where the carriers are unloaded of the tested electronic devices, and then from the unloading stage back to the loading stage to receive a new set of untested electronic devices. Optionally, each carrier comprises a set of secondary carriers which ride in a like number of seats defined by a primary carrier and sets of electronic devices are loaded onto and unloaded from the secondary carriers. Among other uses, the secondary carriers serve as adapters between the various forms of electronic devices and a standard form of primary carrier.

14 Claims, 9 Drawing Sheets

ELECTRONIC DEVICE TEST HANDLER

This is a continuation of application Ser. No. 587,218 filed Sep. 24, 1990, now abandoned.

BACKGROUND OF INVENTION

This invention relates in general to electronic device test handlers having integrated environmental control for testing such devices at selected temperatures. As used herein, the term "electronic device" shall refer to and mean semiconductor devices, integrated circuits, modular packaged hybrid electronic circuits and the like.

Conventionally, handlers for the testing of the electronic devices are of two general types. The first type is commonly characterized as being "gravity fed." In this type of handler, the electronic devices are propelled through the handler by gravity. This type of handler has two very significant disadvantages. It is slower, in that it can handle fewer electronic devices per time unit, and the electronic devices are handled "naked." By the term "naked," it is meant that the devices are handled bare. That is, they are not in any kind of protective media while they are passed through the handler and tested.

The second type of handler is characterized as a "pick and place" handler. In this type of handler, the electronic devices are transported through the handler in batches, typically in a tray. From the batch, the electronic devices are picked and placed in contact with a test head contactor for testing. After testing they are returned to the batch. This type of handler has higher throughput than the gravity-fed type handler, but it also has the major disadvantage of handling the electronic devices naked at the test stage. Electronic devices so handled are susceptible to damage, for example, because of handler malfunction or because of variations in the form of the electronic devices.

This invention has many advantages. First of all, it is not gravity fed and therefore and has higher throughput than the gravity fed handlers, Secondly, electronic devices are placed into a protective medium prior to being handled and carried on trays throughout a handler according to this invention, the devices are carried in their medium, even during the test stage. Moreover throughput is enhanced by overlapping of tray movement operations. Also, use of standard sized trays and electronic device carrier media with a standard interface to the trays gives a handler according to this invention the ability to handle a wide variety of devices with inexpensive change over kits.

Other advantages and attributes of this invention will be discussed in, or will be readily discernable upon a reading of, the text herein after.

SUMMARY OF INVENTION

This invention presents an electronic device handler comprising: (1) an electronic device carrier unit comprising a primary carrier and at least one secondary carrier, the secondary carriers riding atop the primary carrier in seats defined by the primary, each secondary carrier defining at least one seat in which an electronic device is carried atop the secondary carrier with the electronic devices' leads being accessible from above the carrier unit, (2) a pre-test conditioning chamber having therein means for changing the temperature of electronic devices passing through the chamber, (3) means for moving carrier units through the pre-test conditioning chamber in an ordered fashion at a pace suitable to effect a desired temperature change in the electronic devices riding upon the carrier units, (4) a test chamber comprising a path along which a plurality of carrier units can be moved, said path having at least one staging site at which carrier units awaiting test, a test site at which carrier units rest while the electronic devices atop them are being tested, and at least one removal-awaiting site at which carrier units await removal from the test chamber, the test chamber further comprising a test head contactor with downward facing contacts disposed above the path test site, means for moving carrier units from the staging site to the test site, means for lifting the secondary carriers of a carrier unit at the test site in order to bring the leads of the electronic devices atop said secondary carriers into electrical communication with the test head contactors, and means for moving the carrier units from the test site to the removal-awaiting site, (5) means for transferring carrier units from the pre-test conditioning chamber into the test chamber to a staging site, (6) a post-test conditioning chamber having therein means for returning the temperature of electronic devices passing through the chamber to a temperature suitable for safely exposing the electronic devices to ambient temperatures, (7) means for transferring carrier units from the test chamber removal-awaiting site to the post-test conditioning chamber, (8) means for moving the carrier units through the post-test conditioning chamber at a pace suitable to achieve the desired effect, (9) a load-unload path, (10) means for transferring carrier units from a post-test conditioning chamber egress onto the load-unload path, (11) means for transferring carrier units from the load-unload path into the pre-test conditioning chamber ingress, (12) means for moving the carrier units along the load-unload path from the post-test conditioning chamber egress to the pre-test conditioning chamber ingress for reinsertion into the pre-test conditioning chamber, (13) means along the load-unload path for removing tested electronic devices from carrier units as said units move along said path from the post-test conditioning chamber egress point toward the pre-test conditioning chamber, and (14) means along the load-unload path for replacing the removed electronic devices with untested electronic devices.

An object of this invention is to provide an electronic device handler which achieves higher through-rate for the testing of semiconductor devices on that which could be achieved by conventional handlers.

Further object of this invention is to provide a handler as is described previous paragraph but which occupies a smaller floor space than conventional systems.

A further object of this invention is to provide electronic device handler as described in the previous two paragraphs which has the capability of handling the devices while they are seated in protective carriers.

A further object of this invention is to provide an electronic device handler as described above which has the capability of moving the electronic devices through the handler in batches and which have the ability to present the full batch or a subset of a batch simultaneously to test head contactors.

A further object of this invention is to provide an electronic device handler which moves the devices about in a standard size tray, each tray carrying a set or batch of electronic devices. In secondary carriers which uniformly interface to the standard size trays and which provide some degree of protection for the electronic devices so carried.

Other objects of this invention are expressly or impliedly stated in the text of the specification.

BRIEF DESCRIPTION OF THE DRAWINGS

FIG. 12 is an enlarged sectional view taken on line 12—12 of FIG. 3;

FIGS. 14A, B, and C illustrate different configurations of secondary carriers.

DESCRIPTION OF THE PREFERRED EMBODIMENT

Figure 1:
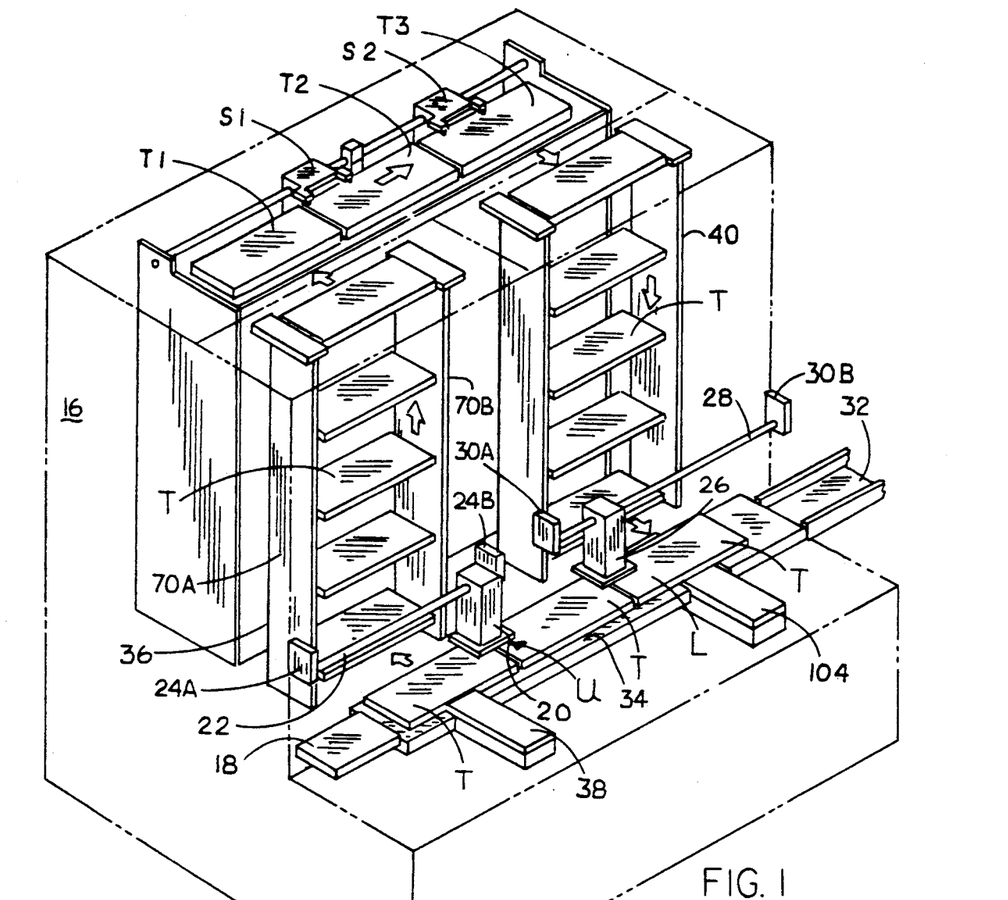
FIG. 1 is a pictorial view illustrating the path and motions of the carrier units through the machine.
Figure 2:
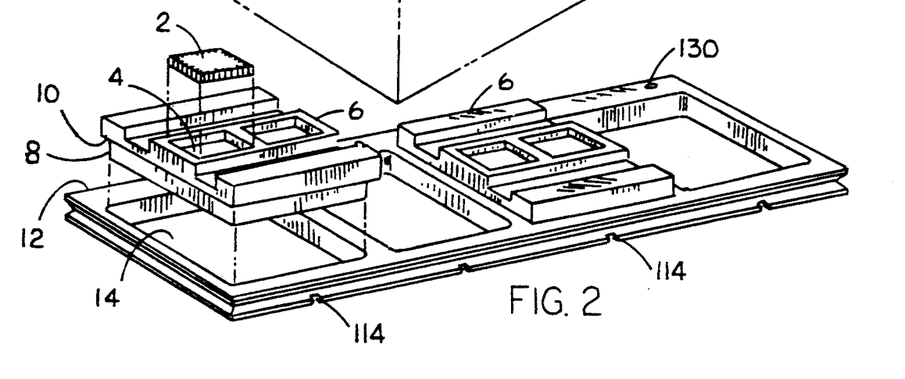
FIG. 2 is a perspective view of one primary carrier in the form of a tray and typical secondary carriers as inserts.

Referring to FIGS. 1 and 2, an electronic device 2 is illustrated as being carried in a seat 4 which is one of two seats defined by secondary carrier which in this embodiment is a device-carrying insert 6. The device-carrying insert has a base 8 reduced in size which defines a marginal shoulder 10. A primary carrier which in this embodiment is a tray 12 in the form of a planar frame which defines four uniform openings 14 each of which conform to the reduced-size base of the device-carrying insert 6 such that the reduced-size base can be slippingly inserted into any one of the four openings with the insert resting on the tray by means of the shoulder 10. Thus, four device-carrying inserts are seatable in the four openings defined by the insert tray, lateral movement of the inserts in any direction being restrained by the frame of the insert tray and vertical movement being limited by gravity.

As will be further discussed, the seats defined by the device-carrying inserts can be differently configured to accommodate the various forms and configurations of electronic devices, but all of the inserts have uniform reduced size bases. While the device-carrying inserts illustrated in FIGS. 1 and 2 have two device seats each, it should be noted that each insert can have a plurality of seats, i.e. four. Thus, the insert trays can carry a wide variety of electronic devices.

Referring specifically to FIG. 1, the arrows illustrate the path and motions of insert trays throughout a test handler 16. Referring again to FIG. 1, the rectangular slabs designated T schematically represent each an insert tray 12 carrying a full compliment of inserts 6. The arrows illustrate the closed route through which the trays T traverse during typical operation of the test handler 16. As illustrated in FIG. 1, the trays T traverse generally from right to left along a front platform 34. As the trays pass under an unloading mechanism, generally U, the device-carrying inserts are unloaded of electronic devices. Then as the trays pass under a load mechanism, generally L, they are reloaded with electronic devices.

A supply platform 18 illustrates in general a means by which this invention receives individual electronic devices, i.e. components. The means by which the components arrive at and upon the supply platform is not a part of this invention. The load mechanism L is used to pick up the individual electronic devices from the supply platform and load them into device-carrying seats 4, preferably in pick-up order, the inserts 6 being seated in insert trays 12. The load mechanism comprises generally a loading pick-up head 20 which moves reciprocally along a track 22 suspended by supports, 24A and 24B. As will be further explained, at the base of the pick-up head is a suction means which grips the electronic devices during the loading process. In operation, the loading head 20 has two positions of rest proximate the opposite ends of the track 22. At a first extent, the loading head 20 is positioned over the supply platform and the suction means (not shown) reaches down, grips and lifts one or more electronic devices. The loading head then moves to the opposite extent of the track and registers the electronic devices with empty device-carrying insert seats and deposits the devices therein by moving down and releasing the suction means. During normal operation of the test handler, the loading head supplies a continuous stream of electronic devices from the supply platform to the device-carrying insert seats.

Referring again to FIG. 1, the opposite operation is accomplished in similar fashion by an unloading head 26 which also has a fixed pitch of movement along a track 28 between supports, 30A and 30B. Unloading head 26 also has a suction means for gripping the individual electronic devices. In operation, it moves to one extent of the track 28 proximate support 30A. It then reaches down and pulls one or more electronic devices from a device-carrying insert. The unloading head then moves to the opposite extent of the track 28 and deposits the electronic devices onto a delivery platform 32. The delivery platform 32 and the means by which the electronic devices are removed from the delivery platform and loaded into tubes or other carrying packages are not a part of this invention. In operation, the unload mechanism continually unloads devices from the device-carrying inserts providing a steady stream of tested devices to the delivery platform.

Figure 4:
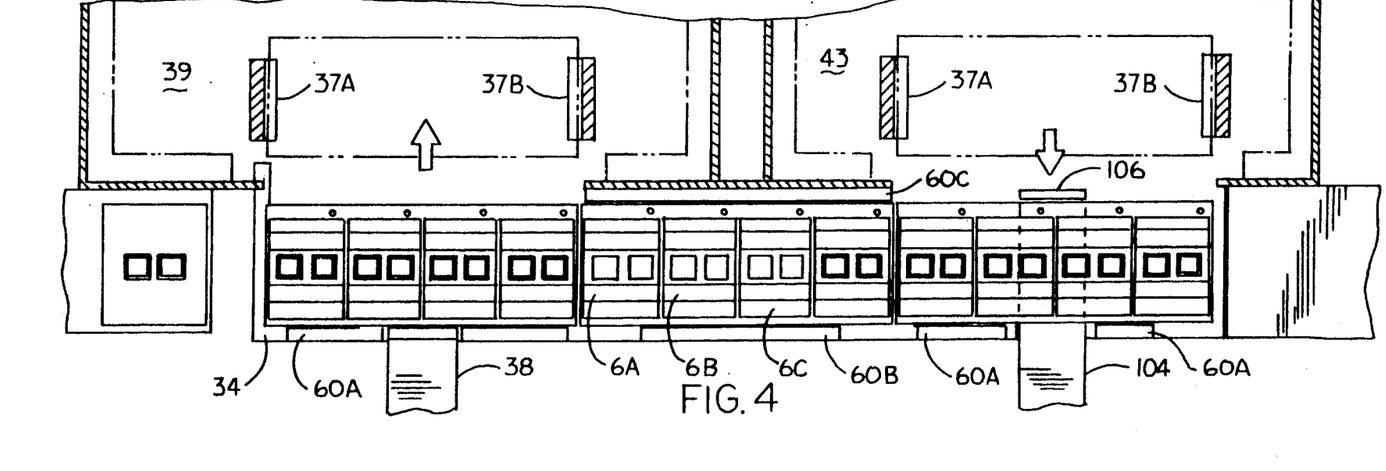
FIG. 4 is a sectional view taken on a line 4—4 of FIG. 3.
Figures 5, 6:
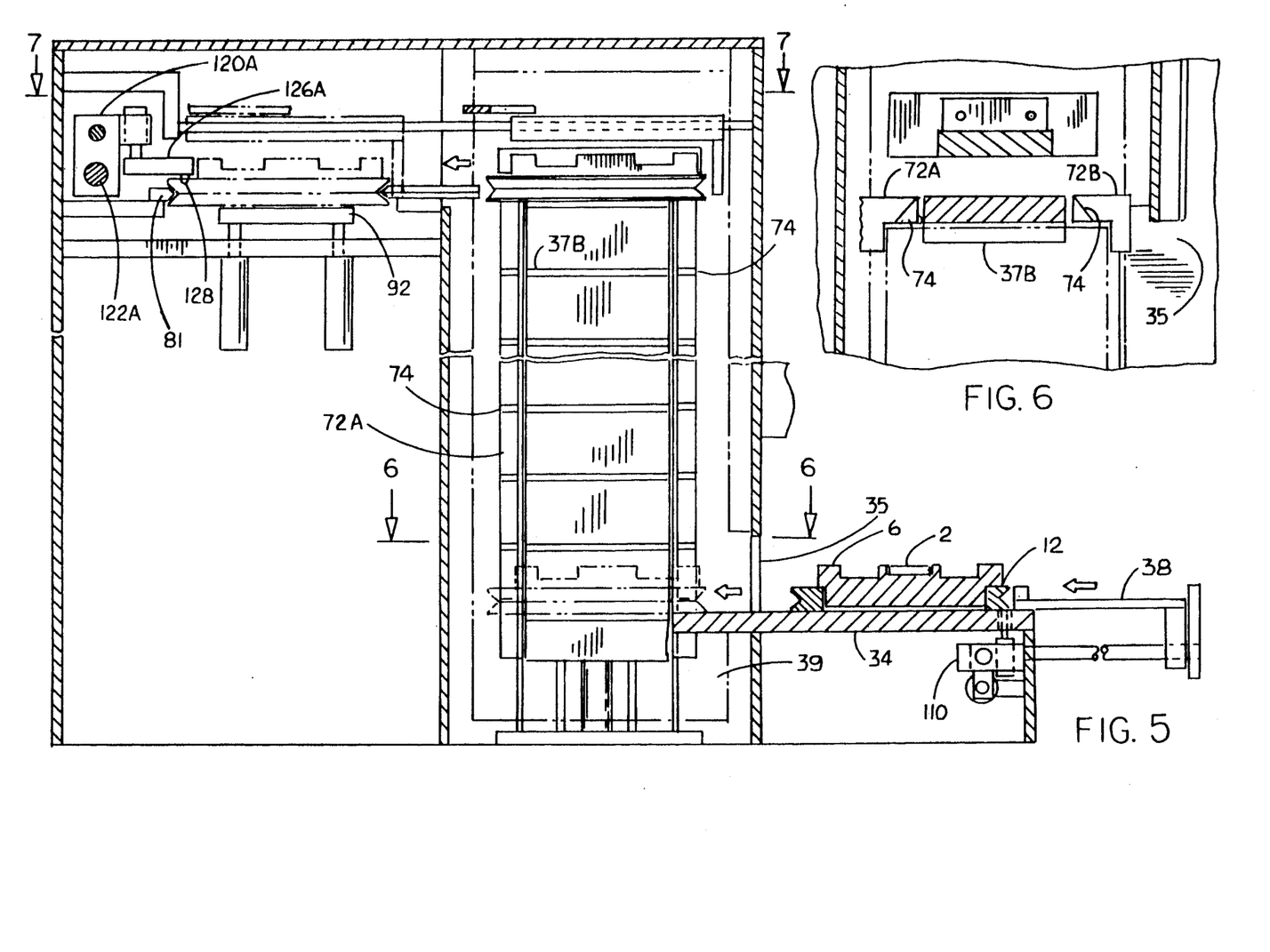
FIG. 5 is an enlarged sectional view taken on line 5—5 of FIG. 3.
FIG. 6 is a sectional view taken on line 6—6 of FIG. 5.

Referring to FIGS. 1 and 4, after each tray has been fully reloaded with untested electronic devices, it is moved to align with an ingress 35 of an elevating conveyor mechanism 36. As will be further explained and illustrated, the elevating conveyor has shelves, 37A and 37B, upon which the trays rest as they are elevated. The elevating conveyor is disposed within an environmental chamber 39 which either elevates or depresses the temperature of the electronic devices as they pass through the chamber toward a test head. The trays are inserted into this environmental chamber and onto an elevating conveyor shelf by a pushing mechanism 38. When each tray reaches the top of the elevator, it is pushed from the shelf upon which it is resting and guided onto a test path or track (not illustrated in this Figure). The tray designated T1 illustrates a tray in a staging site, i.e., it is waiting to be moved to a test site under the test head (not illustrated in this Figure) which is directly above the tray designated T2. The tray designated T3 has been tested and is at an awaiting removal site, i.e. it is waiting to be moved onto a tray lowering conveyor 40. While on the test track, there are two independently moveable shuttles, S1 and S2. S1 accomplishes the purpose of moving the trays waiting to be tested or being tested under the test head. The second shuttle S2 moves the tested trays from under the test head to a position aligned with a ingress 41 (see FIG. 13) to the lowering conveyor. Once in that position, the exiting tray waits for an open shelf and is then pushed onto the open shelf and subsequently lowered through a chamber 43 (see FIG. 12) which permits the electronic devices to unsoak, i.e. return to substantially ambient external temperature.

The first shuttle S1 moves the trays in step fashion. For example, if the test head has a sufficient number of contactors to contact all of the electronic devices carried by a tray simultaneously, then the first shuttle will move, i.e. index, each tray step wise a full tray length at a time. If, however, the test head has only the capacity of contacting a subset of the electronic devices carried by a tray, the first shuttle will index the trays alone in steps equal to the number of electronic devices capable of being handled by the test head. On the other hand, the second shuttle moves the fully tested tray in one step to the position for exiting onto the lowering conveyor. In this fashion the operations of the two shuttles can overlap and a tray can be moving in or into the test site while a tray containing all tested devices can be moving toward the awaiting-removal site. This accomplishes faster through-put.

Figure 3:
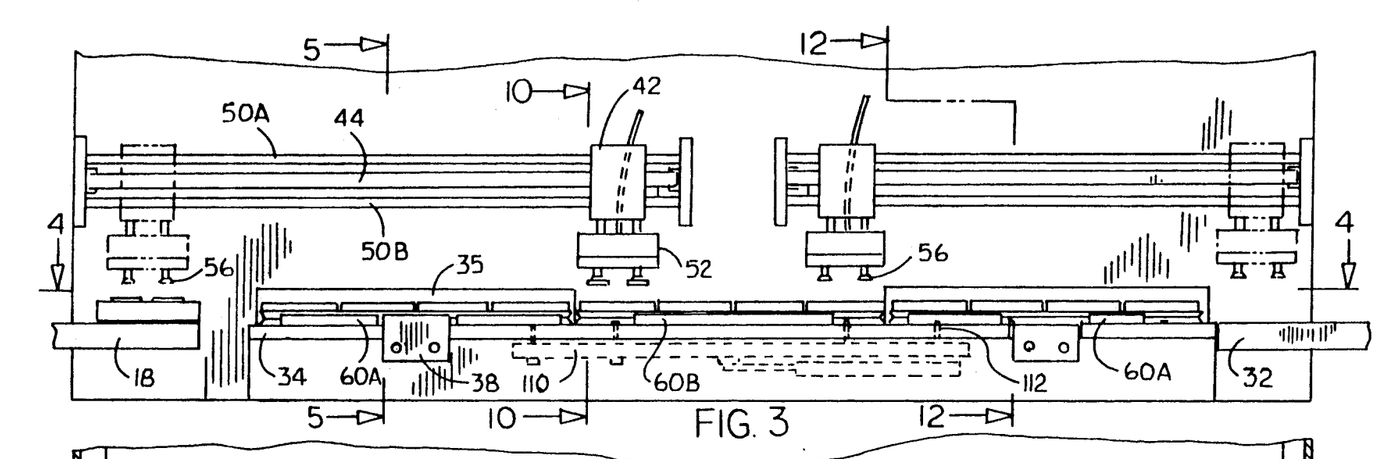
FIG. 3 is a front elevation view of the electronic device loading and unloading and carrier unit advance mechanism.
Figures 10, 11:
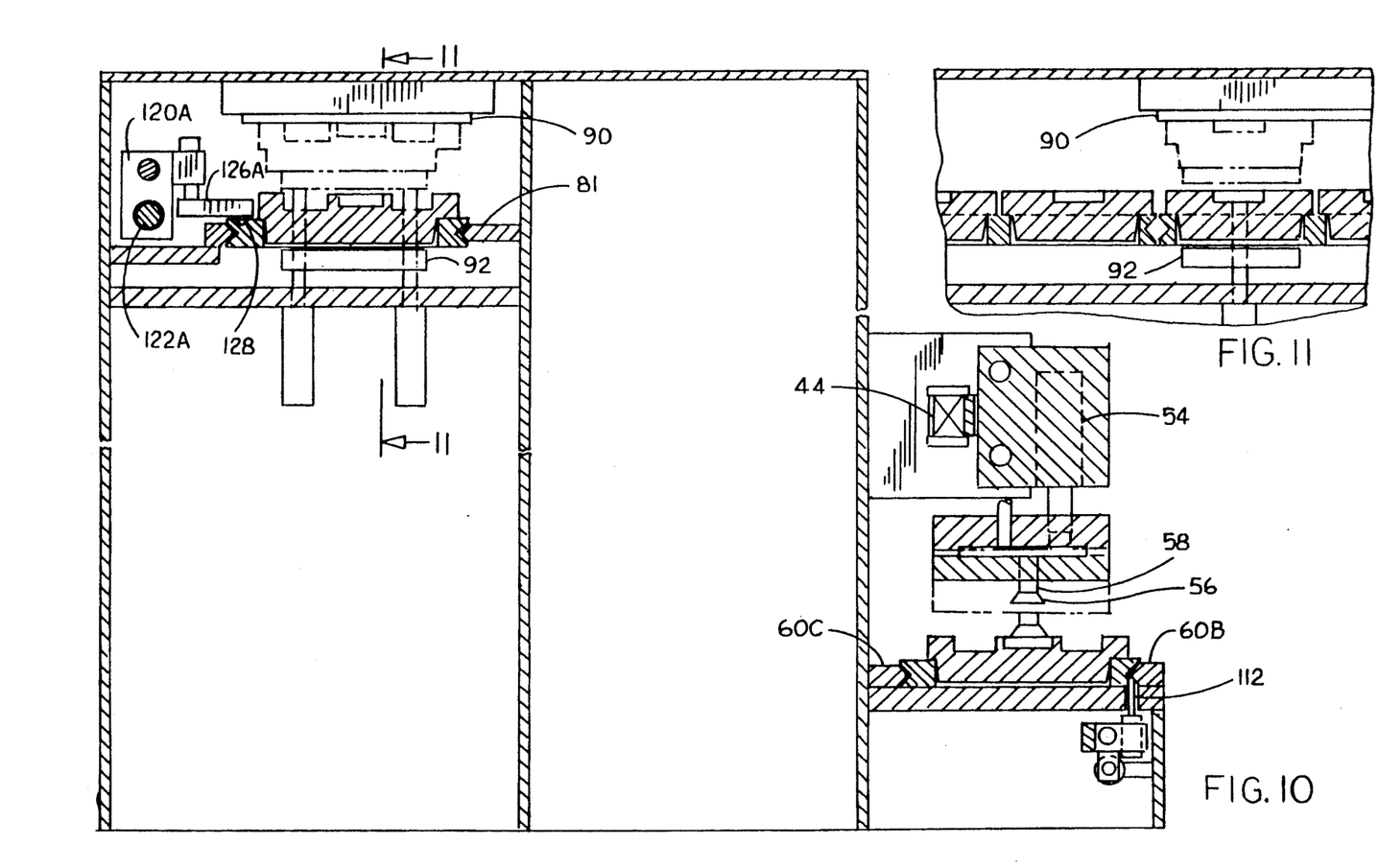
FIG. 10 is an enlarged sectional view taken on line 10—10 of FIG. 3.
FIG. 11 is a sectional view taken on line 11—11 of FIG. 10.

Referring to FIGS. 3 and 10, the load mechanism is illustrated in more detail. The loading head 20 is illustrated as comprising a trunion or carrier block 42 being affixed to a linear actuator 44 by any suitable means. In operation, the carrier block is moved by the belt in basically a two-stroke movement. In one motion, the block 42 is moved to a position above the loading platform 18 to pick up devices, and in a reciprocal motion the block is moved to a position more suitable for loading electronic devices onto a tray centered on the front platform 34. In its movement, the carrier block is guided by guide rods 50A and 50B which are parallel to the movement of the belt and which slip through bores defined by the carrier block. Extending beneath the carrier block is a pick-up head 52 which moves reciprocally up and down by an actuator 54. Protruding from the bottom surface of the pick-up head is at least one suction means which is illustrated as a pair of suction cups 56 on the necks 58. The actuator 54 moves the pick-up head between two positions, one position wherein the suction cup is in contact with and presses against an electronic device and a second higher position wherein the electronic device is above the front platform and the supply platform a sufficient distance to allow clearance when the loading head is being moved by the linear actuator 44.

Referring to FIGS. 3, 4, 5, and 10, the front platform, 34 is illustrated in more detail. FIG. 4 illustrates the front platform with three insert trays atop the platform. Each insert tray is illustrated as carrying four device-carrying inserts with two electronic devices each. The trays are guided in their movement from right to left on top of the front platform by a plurality of outboard V-shaped channel guides, 60A and 60B, and by a centered inboard V-shaped guide 60C. In FIG. 4 to the left of the inboard V-shaped guide 60C, there is a gap wherein no guide is disposed. This gap permits ingress of the left most tray into the elevator conveyor and soak chamber. The absence of a V-shaped guide in the gap to the right of the centered V-shaped guide 60C allows for the egress of trays from the unsoak chamber onto the front platform.

Referring again to FIG. 4, the tray in the center of the front platform 34 as illustrated contains three inserts, 6A, 6B and 6C which have been unloaded, i.e. their electronic devices have been removed. The right most insert of the center tray still contains devices which have not yet been unloaded, but which have been tested. FIG. 3 illustrates the loading head being in a position to deposit electronic devices into the left most insert of the centered insert tray, and it also illustrates the unloading head in a position to remove the two remaining tested electronic devices in the right most insert of the centered insert tray.

Referring to FIGS. 6–9, the elevating conveyor is illustrated in greater detail. Two vertical beams, 70A and 70B, are variably spaced apart. On the inside face of each beam, that is, the side of each beam facing the other beam, there are a plurality of horizontal shelves, 37A and 37B. The shelves on each beam are uniformly spaced and in operation the shelves of one beam at all times aligns with the shelves of the facing beam. The beams are moveable and have at least four distinct positions. Horizontally they have a position where they are the closest together. In this position, the beams can be said to be contracted. In their contracted position, the beams are close enough together to allow the insert to trays rest upon pairs of aligned shelves. Horizontally, the beams also have an expanded position where they are farthest apart. In this position, the gap between the shelves does not permit the trays to rest thereon. The beams also have high and low vertical positions. The arrows in FIG. 8 associated with the beam 70b on the right side of the conveying elevator indicate the path and direction of motion of that particular beam as driven by horizontal actuators 71A and 71B, and vertical actuator 69. The beam on the left side of the conveying elevator moves in coordination but in a counter-clockwise direction.

Figures 8, 9:
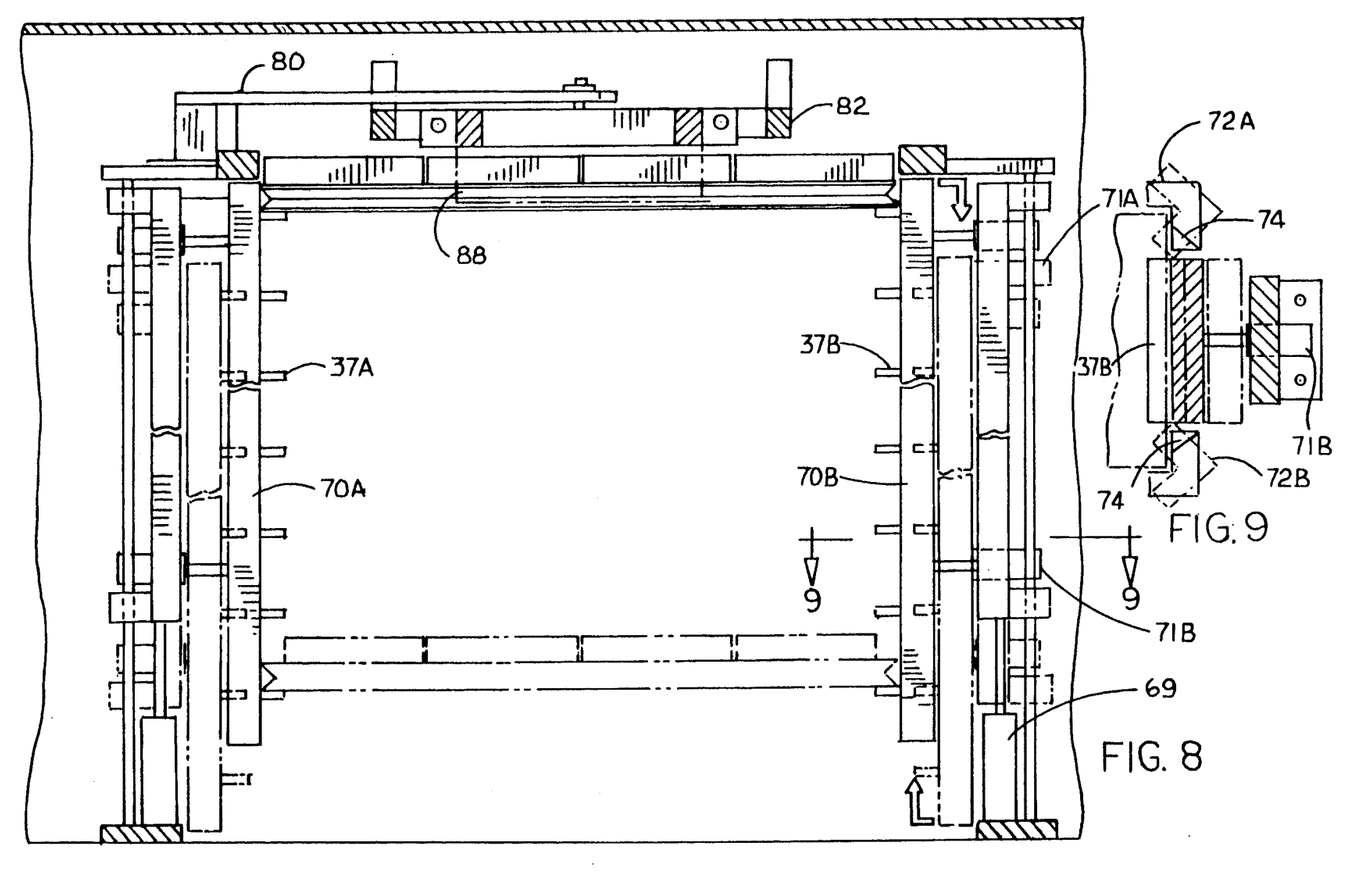
FIG. 8 is a sectional view taken on line 8—8 of FIG. 7.
FIG. 9 is a sectional view taken on line 9—9 of FIG. 8.

Referring to FIG. 9, the insert trays are illustrated as having a width greater than the length of the shelves of the beams, 70A and 70B. Along either edge of each beam, is a rotatable post (72A and 72B) containing retainer tabs 74. The retainer tab beams are fixed vertically and horizontally. The purpose of the retainer tabs is to rotate underneath the insert trays in anticipation of the shelf beams expanding. In the absence of the support from the shelves, the retainer tabs hold the insert trays in place as illustrated in phantom. When the shelf beams subsequently contract to provide support for the shelves, the retainer tabs rotate to the position where they are clear of the insert trays as illustrated in solid lines.

Referring to FIG. 8 and considering the insert tray shown in phantom, the movement of that tray up the conveyor elevator is done in the following steps. First of all the retainer tabs rotate under the insert trays to hold them in place followed by the shelf beams contracting, i.e. pulling the shelves away from the trays. The shelf beams move down to their low position and contract moving the shelves back underneath the insert trays. The retainer tabs then rotate away giving clearance to the shelf supported insert trays and the shelf beams move vertically upward to their high position. Thus during those steps, each insert tray in the conveyor has moved up one shelf. This process is continually repeated throughout the operation of the test handler. When an insert tray reaches the top shelf and the shelf beams are in their high position, the top insert tray is in alignment to be slid from the top shelf onto a pair of facing V-shaped grooves toward the test track.

Figure 7:
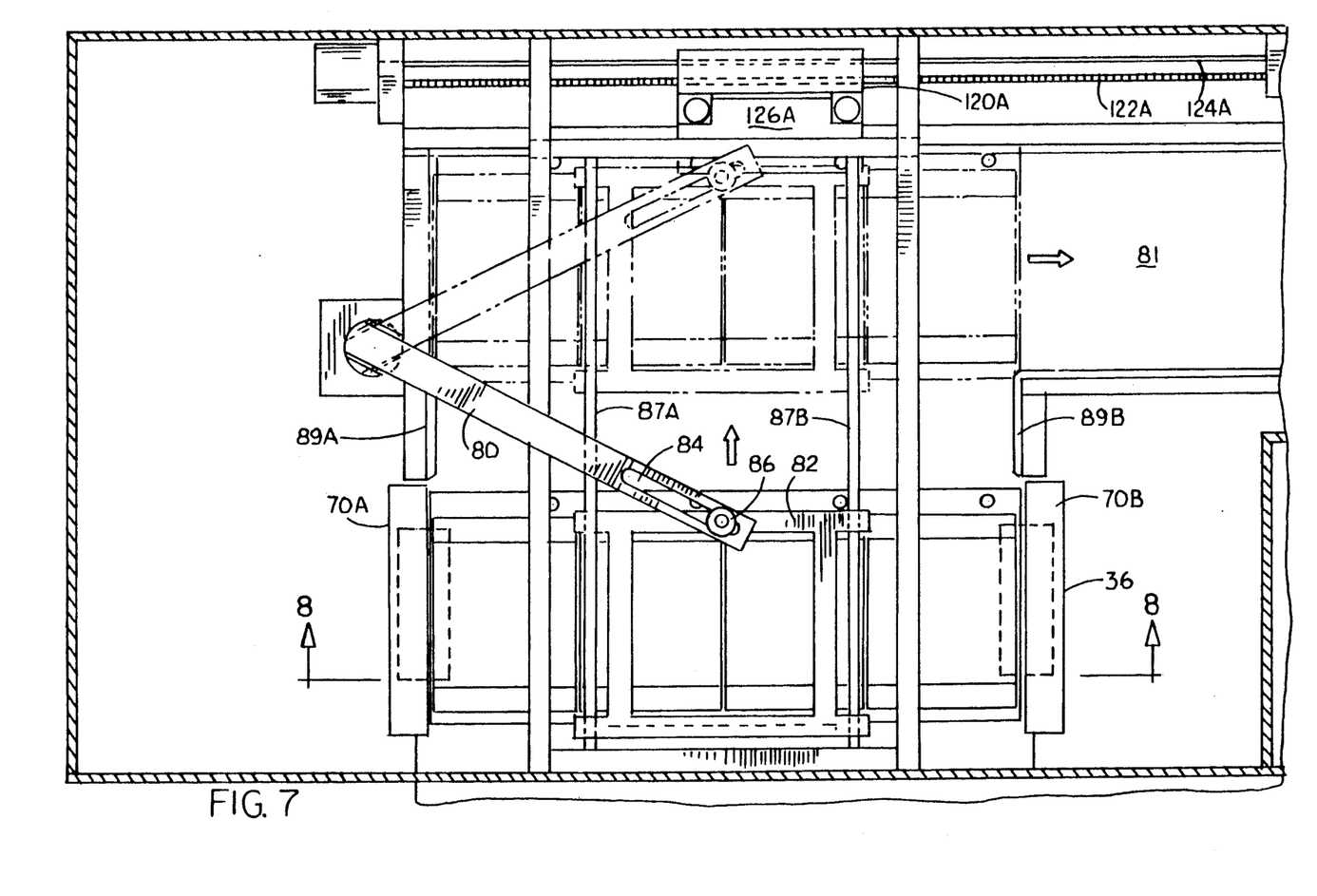
FIG. 7 is a sectional view taken on 7—7 of FIG. 5.
Figures 12, 14A, 14B, 14C:
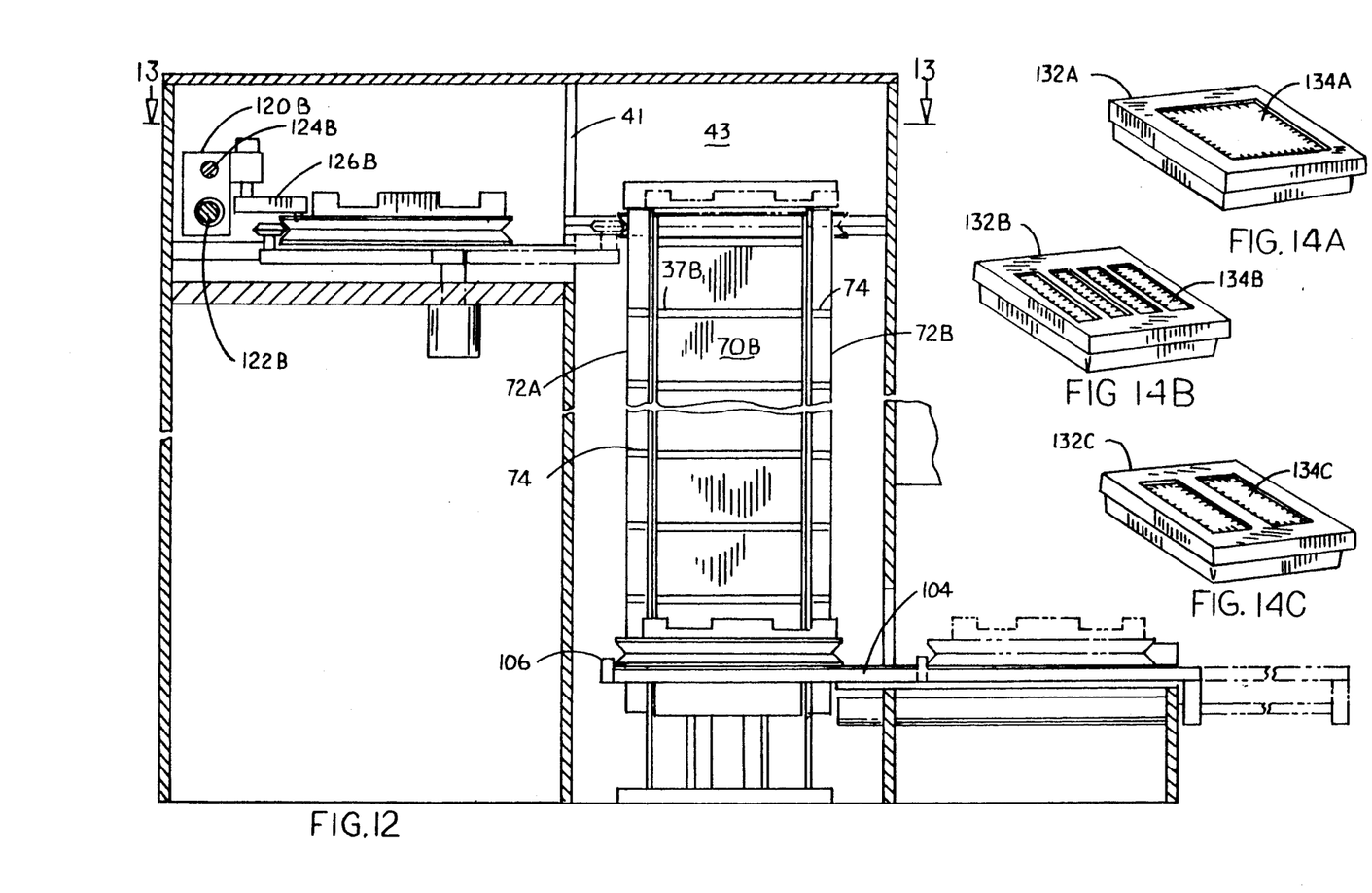

Referring to FIG. 12, the lowering conveyor 40 moves the insert trays in much the same manner as the elevating conveyor, however, the operation of the shelf beams and retainer tabs are essentially reversed. The right most beam operates in a counterclockwise direction and when the beams are contracted that is, when their shelves are supporting the insert trays, they move from the high position to the low position, and when they are expanded, they move from the low position to the high position. The retainer tabs perform the same functions as the retainer tabs in the elevating conveyor, i.e., they hold the trays while the shelf beams are in the expanded position. Referring to FIG. 7, an insert tray is shown to be on the top shelf of the conveying elevator 36. A pivoting ar 80 has a frame 82 slidably engaged thereto by means of a slot 84 defined by the arm and a slot rider 86. The pivoting arm is operable to move the frame from a first position centered over the top shelf of the conveying elevator and a second position over the test track 81. A pair of guide rods, 87A and 87B, insure that the movement of the frame is linear notwithstanding the angular movement of the driving arm 80. FIG. 8 illustrates a flange 88 along an outboard edge of the frame 82, the flange extending downward so as to catch and inwardly push an insert tray in the top position of the conveying elevator. To insure straight movement of the insert tray from the conveying elevator to the test track, V-shaped guide rails, 89A and 89B, are provided along the outward of the edges of the path. Once the insert tray is in the test track, further V-shaped guides provide lateral stability for the insert trays as they move along the test track.

Referring to FIGS. 10 and 11, the mechanism and movement of individual device-carrying inserts to bring the electronic devices into contact with a test head contactor 90 is illustrated. The test head contactor is fixed in a certain position above the test track, preferably centered with respect to the length of the test track so that the centered insert tray is the one being tested. In these illustrations, only a test head contactor with the capacity of simultaneously testing two electronic devices is shown. Thus, movement of only one device-carrying insert is necessary and movement of the trays along the test track are in steps equal to the pitch of the device-carrying inserts. Once an insert is located and registered with the test head contactor, an elevator platform 92, i.e., a pusher, below the insert moves up lifting the insert from its socket in the insert tray and bringing it in contact with the test head contactor. When testing is completed, the elevator platform moves down allowing the insert to settle into its socket in the tray. The tray is then moved forward, i.e. to the right according to the orientation of the illustrations, until the next immediately following insert is registered below the test head. There can however, be more than one pusher. For example, there can be four pushes to simultaneously bring the electronic devices in four inserts into contact with a test head contactor of suitable capacity.

Figure 13:
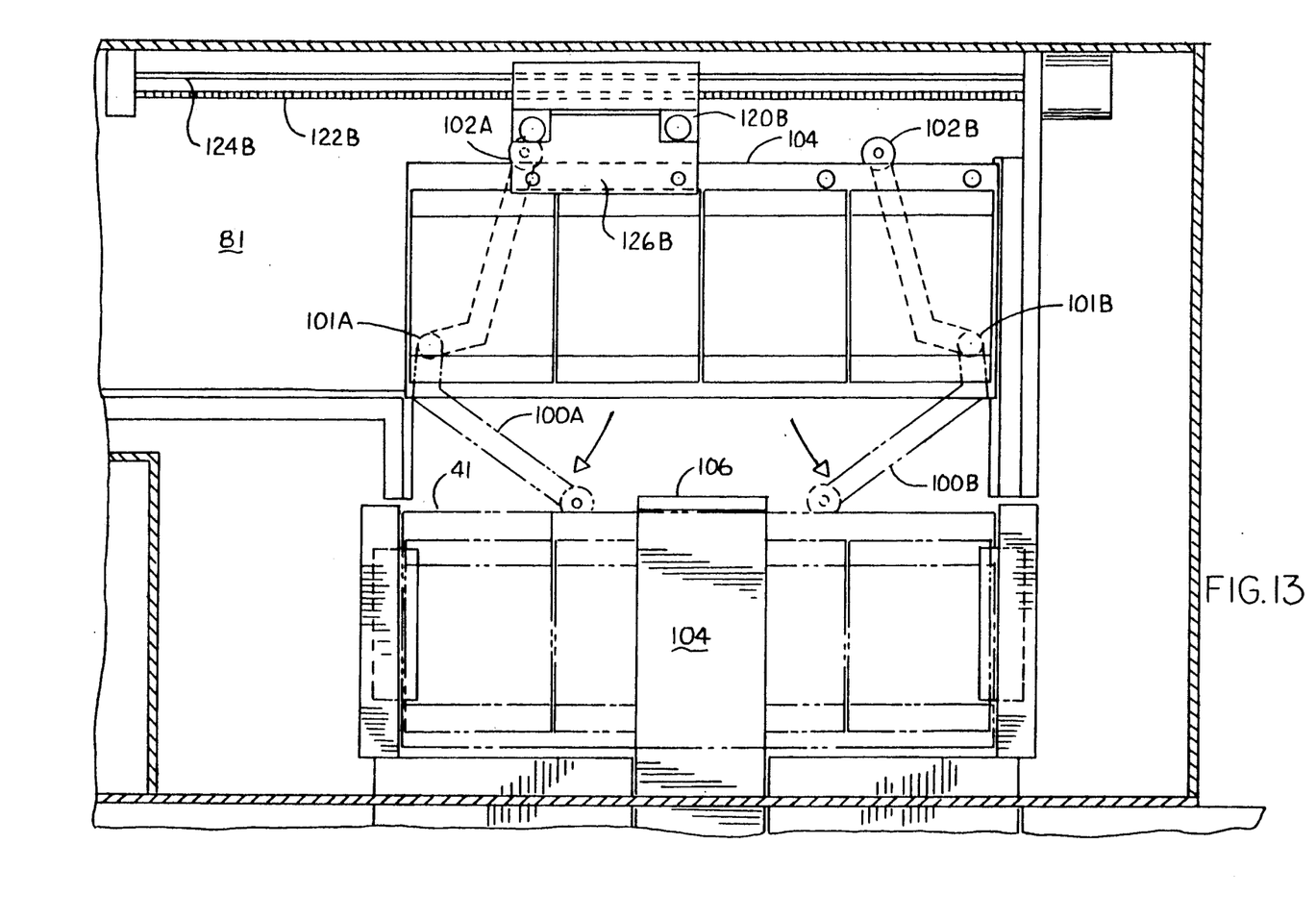
FIG. 13 is a sectional view taken on line 13—13 of FIG. 12.

Referring to FIG. 13, the mechanism for removing the insert trays from the test track to the top position of the lowering conveyor is illustrated. A pair of opposing extraction arms, 100A and 100B, are pivoted. At the ends of the extraction arms remote from pivots are the V rollers, 102A and 102B, one each for the arms. The V-shaped rollers ride in the grooves on the corresponding side of the insert tray. As the arms are rotated, the right arm counter-clockwise and the left arm clockwise, the tray is pushed from the test track toward the unsoak chamber 43. As each tray reaches the bottom position in the unsoak chamber, an extractor tongue 104 with a upward protruding flange 106 hooks the bottom tray and pulls it out onto the front platform 34.

Referring to FIGS. 3, 5, 10 and 15, the mechanism by which the trays are moved along the front platform is illustrated. A sliding advance bar 110 disposed beneath the front platform and generally centered longitudinally carries a plurality of vertically projecting pins 112. In the case as illustrated, there are four such pins. These pins can be raised and lowered alternately to a high position and low position, respectively. In their low positions, they are clear of the insert trays above them. In their high positions, they engage any insert trays above them by means of notches 114 defined by the outboard edge of each insert tray (illustrated in FIG. 2). In the insert trays of this embodiment, there are four such notches. In the embodiment illustrated, the notches are located along the edge of the trays so that the trays can be step advanced one device-carrying insert per step. In operation, at a point when the trays need to be advanced, the advance bar moves to its right most extent, raises the pin and engages one or two trays depending on their positions; the advance bar then moves to its left most extent and lowers the pins. In this fashion, the trays are all advanced, i.e. indexed, one device-carrying insert at a time.

Referring to FIGS. 5, 7, 10, 12, 13, and 15, the mechanisms by which the trays are advanced in the test track are illustrated. As previously explained, there are two independently moveable shuttles, 120A and 120B. The shuttles move along the test track between their respective extents by corresponding screws, 122A and 122B, which engage threads defined by the shuttles. These shuttles also have bores through which corresponding guides, 124A and 124B, parallel to these screws provide guided movement of the respective shuttles. Each shuttle supports a head, 126A and 126B, carrying at least two tray engaging pins 128 fixed in the head. The shuttle heads are moveable up and down between two positions. A high position where they are clear of the insert trays and a low position where the pins engage sockets 130 along the inboard side of the insert trays. For each shuttle, the space in between its corresponding tray engagement pins equals the spacing between any immediately adjacent pair of sockets on a tray. The independent movement of the two shuttles provides for faster operation and relatively independent handling of trays moving toward and into the test position and trays being removed away from the test head adjacent pair of sockets on a tray. The independent movement of the two shuttles provides for faster operation and relatively independent handling of trays moving toward and into the test position and trays being removed away from the test head position. When the first shuttle 120B tray to a last test position, it then can release from the tray and return to its home position, that is, the position to catch a tray in the staging site. However, the first shuttle 120B does not release the tray under test until it is caught by the second shuttle 120B. In this fashion, the trays along the test track are always under control of one of the shuttles. When the last set of electronic devices in a particular tray under test has completed testing, the second shuttle moves the tray to the awaiting-removal site. While the first shuttle is moving its quad tray from the staging site to the testing site. In general, during the testing of one tray, another tray can be moving—either moving toward the test site or moving toward the awaiting-removal site.

Referring to FIGS. 14A, 14B and 14C, alternate configurations for the device-carrying inserts 6 are shown. FIG. 14A illustrates an insert 132A carrying one large device 134A. FIG. 14C illustrates an insert 132B carrying two dual-in-line devices 134B. FIG. 14B illustrates an insert 132C carrying four dual-in-line devices 134C.

Figure 15:
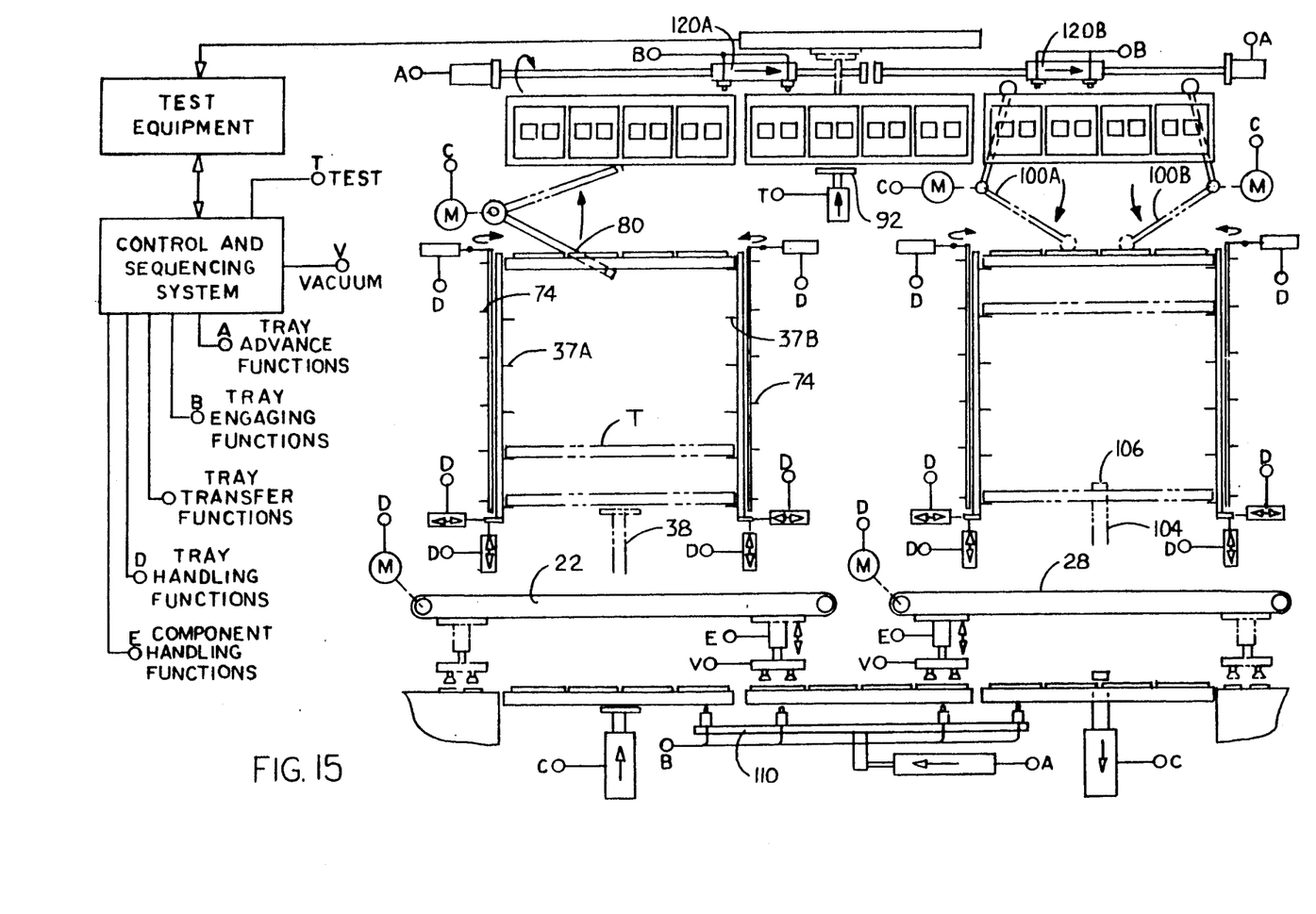
FIG. 15 is a diagram of the control and actuating system of this invention.

Referring to FIG. 15, a control and sequencing system is shown to provide the vacuum functions for the pick-up heads, tray advance functions, tray engaging functions, and tray transfer functions, tray handling functions, and component handling functions for the system.

We claim:

1. A device for presenting electronic devices to a tester for testing comprising:
   (a) a plurality of carriers each for carrying a set of electronic devices,
   (b) a loading stage,
   (c) a pre-test chamber,
   (d) a test stage,
   (e) a post-test chamber,
   (f) an unloading stage,
   (g) means for loading a set of electronic devices onto each carrier when a carrier is at the loading stage,
   (h) means for unloading a set of electronic devices from each carrier when a carrier is at the unloading stage,
   (i) means for providing electrical contact between the tester and a set of electronic devices carried by a carrier when a carrier is at the test stage, and
   (j) means for cyclically conveying the plurality of carriers in a closed loop from the loading stage through the pre-test chamber, from the pre-test chamber to the test stage, from the test stage to the post-test chamber, through the post-test chamber to the unloading stage, and from the unloading stage to the loading stage, each carrier being paused at the loading stage long enough to have a set of electronic devices loaded onto it, each carrier being paused at the test stage long enough for desired tests to be performed on the set of electronic devices carried by the carrier, each carrier being paused at the unload stage long enough for it to be unloaded of electronic devices.

2. The device according to claim 1 wherein the carriers are primary carriers and further comprising a plurality of secondary carriers, each primary carrier carrying a set of secondary carriers and each secondary carrier carrying a set of electronic devices, the means for loading a set of electronic devices being operative to load the set onto the set of secondary carriers of a primary carrier at the loading stage, the means for unloading a set of electronic devices being operative to unload the set of electronic devices from the set of secondary carriers of a primary carrier at the unloading stage.

3. The device according to claim 2 wherein each secondary carrier is disposed in a seat defined by its primary carrier and held there by gravity, and wherein the means for providing the electrical contact between the tester and the set of electronic devices comprises a test head with downward facing contactors disposed above the test site and means for lifting the set of secondary carriers of a primary carrier at the test site to a point where the leads of the electronic devices carried by said set of secondary carriers are in electrical communication with the test head contactors.

4. The device according to claim 3 further comprising a through-hole defined by the primary carriers at the base of each secondary carrier seat, and wherein the means for lifting a set of secondary carriers at the test site comprises means acting through each through-hole for elevating the secondary carrier seated atop the through-hole from tis seat to a point where the leads of the set of electronic devices carried by the elevated secondary carrier are in electrical communication with test head contactors.

5. A device according to claim 1 wherein the pre-test chamber defines an ingress and egress and further comprises an elevating conveyor therein having a plurality of seats each for holding a carrier, means for moving a carrier from the loading stage through the ingress and onto a bottom seat of the elevating conveyor, means for incrementally moving the seats upward toward the egress, and means for removing a carrier from the top seat of the elevating conveyor and removing it from the pre-test chamber through the egress.

6. A device according to claim 1 wherein the post-test chamber defines an ingress and a egress and further comprises a descending conveyor therein having a plurality of seats each for holding a carrier, means for inserting a carrier through the ingress onto a top seat of the descending conveyor, means for incrementally moving the seats downward toward the egress, and means for removing a carrier from the bottom seat of the descending conveyor and removing it from the post-test chamber through the egress onto the unloading stage.

7. A device according to claim 1 wherein the means for loading a set of electronic devices onto each carrier when a carrier is at the loading stage comprises a loading head which reciprocally travels between the load stage and a source of electronic devices and means affixed to the load head for picking one or more individual electronic devices at the source of electronic devices and releasing the electronic devices at the loading stage onto a carrier.

8. A device according to claim 1 wherein the means for unloading a set of electronic devices from each carrier when a carrier is at the unloading stage comprises an unload head which reciprocally travels between the unload stage and a delivery platform and means affixed to the unload head for picking one or more individual electronic devices from a carrier and releasing the picked devices at the delivery platform.

9. A device according to claim 1 further comprising a pre-test stage intermediate the pre-test chamber and the test stage where a carrier exiting the pre-test chamber can be paused if the test stage is occupied by another carrier, a post-test stage intermediate the test stage and the post-test chamber where a carrier being conveyed from the test stage to the post-test chamber can be paused to await an open seat in the post-test chamber, two means independently operable, one for conveying a carrier from the pre-test stage to the test stage and the other means for conveying a carrier from the test stage to the post-test stage.

10. A device according to claim 2 wherein the pre-test chamber defines an ingress and egress and further comprises an elevating conveyor therein having a plurality of seats each for holding a primary carrier, means for moving a primary carrier from the loading stage through the ingress and onto a bottom seat of the elevating conveyor, means for incrementally moving the seats upward toward the egress, and means for removing a primary carrier from the top seat of the elevating conveyor and removing it from the pre-test chamber through the egress.

11. A device according to claim 2 wherein the post-test chamber defines an ingress and a egress and further comprises a descending conveyor therein having a plurality of seats each for holding a primary carrier, means for inserting a primary carrier through the ingress onto a top seat of the descending conveyor, means for incrementally moving the seats downward toward the egress, and means for removing a primary carrier from the bottom seat of the descending conveyor and removing it from the post-test chamber through the egress onto the unloading stage.

12. A device according to claim 2 wherein the means for loading a set of electronic devices onto each primary carrier when a primary carrier is at the loading stage comprises a loading head which reciprocally travels between the load stage and a source of electronic devices and means affixed to the load head for picking one or more individual electronic devices at the source of electronic devices and releasing the electronic devices at the loading stage onto a primary carrier.

13. A device according to claim 2 wherein the means for unloading a set of electronic devices from each primary carrier when a primary carrier is at the unloading stage comprises an unload head which reciprocally travels between the unload stage and a delivery platform and means affixed to the unload head for picking one or more individual electronic devices from a primary carrier and releasing the picked devices at the delivery platform.

14. A device according to claim 2 further comprising a pre-test stage intermediate the pre-test chamber and the test stage where a primary carrier exiting the pre-test chamber can be paused if the test stage is occupied by another primary carrier, a post-test stage intermediate the test stage and the post-test chamber where a primary carrier being conveyed from the test stage to the post-test chamber can be paused to await an open seat in the post-test chamber, two means independently operable, one for conveying a primary carrier from the pre-test stage to the test stage and the other means for conveying a primary carrier from the test stage to the post-test stage.

* * * * *